(12) United States Patent
Karasawa

(10) Patent No.: US 6,221,167 B1
(45) Date of Patent: Apr. 24, 2001

(54) PROCESS AND SYSTEM FOR TREATMENTS BY FLUIDS

(75) Inventor: Yukihiko Karasawa, Ohmiya (JP)

(73) Assignee: Applied Science Karasawa Lab. & Co., Ltd., Ohmiya (JP)

( * ) Notice: Subject to any disclaimer, the term of this patent is extended or adjusted under 35 U.S.C. 154(b) by 0 days.

(21) Appl. No.: 09/028,254

(22) Filed: Feb. 23, 1998

(30) Foreign Application Priority Data

Feb. 13, 1998 (JP) ................................................ 10-031859

(51) Int. Cl.⁷ .............................. B05B 1/24; B08B 3/12; B08B 6/00
(52) U.S. Cl. .............................. 134/1; 134/1.3; 134/19; 134/107; 134/108; 134/902; 239/135
(58) Field of Search ................................ 134/1, 1.3, 19, 134/107, 108, 902; 239/135

(56) References Cited

U.S. PATENT DOCUMENTS

| | | | |
|---|---|---|---|
| 5,261,965 | * 11/1993 | Moslehi | 134/1 |
| 5,746,233 | * 5/1998 | Kuroda et al. | 134/57 R |
| 5,820,689 | * 10/1998 | Tseng et al. | 134/3 |

\* cited by examiner

Primary Examiner—Zeinab El-Arini
(74) Attorney, Agent, or Firm—Armstrong, Westerman, Hattori, McLeland & Naughton, LLP

(57) ABSTRACT

The invention provides a treating process and system using a chemical treating liquid, which enables uniform treatments to be carried out within a reduced period of time. A heating tube is used to heat a fluid passing therethrough by irradiation of the fluid with microwaves. A pressurizer is provided upstream of the heating tube, and a throttle valve is provided downstream of the heating tube, so that the boiling of the fluid is prevented by activating the pressurizer to increase the internal pressure of the heating tube. A mixer comprising opposite nozzles is provided to jet fluids from the nozzles for collision with each other, so that the fluids are uniformly mixed. The treating process and system are suitable for semiconductor unit production.

19 Claims, 6 Drawing Sheets

PROCESS AND SYSTEM FOR TREATMENTS BY FLUIDS

BACKGROUND OF THE INVENTION

The present invention relates generally to a system for heating liquids and gases usable for various treatments inclusive of chemical treatments and washing treatments, and more particularly to a process and system comprising a unit for heating a treating liquid effectively within a reduced time of period and mixing the treating liquid uniformly within a reduced period of time.

In washing treatment steps for washing and otherwise treating surfaces of substrates with treating liquids as well as in various treatment steps making using of chemical reactions, the treating liquids are heated to increase chemical reaction rates due to said treating liquids, thereby reducing treating periods of time. In general, chemical reaction rates increase largely with increasing temperature; it is desired to increase reaction temperatures as high as possible.

FIG. 11 is a representation illustrative of one example of a conventional system making use of a chemical treating liquid.

A treating vessel 1 is filled with a treating liquid 2 up to a treating liquid level 3, wherein an article 4 to be treated is immersed in the treating liquid 2 so that the article 4 is treated with the treating liquid 2. The treating liquid 2 is fed from a reservoir 5 for receiving an overflow of treating liquid from the treating vessel via a pump 6 to a filter 7 where it is filtered. Then, the treating liquid is heated to a predetermined temperature by a heating unit 8 using an electrically heated wire or an electric bulb as a heating source, whence it is fed back to the treating vessel. The treating liquid is consumed due to its evaporation during circulation or because a portion thereof is discharged along with the article 4 from the system to the outside. In general, the treating liquid is largely consumed by the evaporation of a liquid component because it is heated to a temperature close to its boiling point. To prevent an increase in the concentration of the treating liquid due to liquid losses, a level sensor 9 is provided in the treating liquid reservoir 5 to detect a treating liquid loss due to evaporation, etc., thereby opening a diluting liquid feeding valve 10 to replenish a diluting liquid from a diluting liquid vessel 10 to the reservoir 5. On the other hand, outputs of a thermometer 12 for measuring the temperature of the treating liquid, liquid sensor 9 and the like are sent to a control 13, which in turn adjusts a diluting liquid adjusting valve 11 or the like to keep the amount and temperature of the treating liquid in predetermined ranges.

The treating vessel 1 and treating liquid reservoir 5 are heated and insulated by a heating and insulating member 14 called a rubber heater, and the treating liquid denatured in the treating vessel is discharged as a drain 15 to the outside.

When the article is treated with the treating liquid heated to its boiling point or a temperature close thereto, the amount of the treating liquid evaporated increases with an increase in the liquid component to be replenished. When the treating liquid is an aqueous solution, it is required to make up for water that is lost by evaporation. Upon the fresh liquid added to the treating liquid, however, the concentration and temperature thereof may vary. The variation in the concentration or temperature of the treating liquid may then have an adverse influence on the article 4 to be treated. For the heating unit 8 used to heat the treating liquid, a heating unit comprising a quartz tube and a nichrome wire or an electric bulb mounted therearound is ordinarily employed. However, it is required to make frequent replacements of quartz tubes to avoid possible damage to the quartz tube by heating.

When the treating liquid is heated via the quartz tube, much time is needed for heating the treating liquid. A problem with such long-term heating is the degradation of the treating liquid, etc.

A semiconductor production process in particular involves a number of treating steps using treating liquids, including the step of washing silicon wafers. Consistent treatments using treating liquids have a great influence on the properties of semiconductor devices, and treating time reductions have a great influence on productivity improvements as well.

It is therefore one object of the invention to provide a treating process and system that enable a uniform treatment using a chemical treating liquid to be achieved within a reduced period of time.

Another object of the invention is to provide a process and system that make it possible to achieve consistent yet short-term treatments in a semiconductor production process comprising steps of substrate washing, resist removal, resin layer removal, nitride or oxide film removal, and etching.

SUMMARY OF THE INVENTION

According to the invention, there is provided a treating process of treating an article (to be treated) with a heated fluid, wherein a fluid is heated by irradiating a heating tube through which said fluid is passed with microwaves.

Preferably, the heating tube includes a heating medium that generates heat upon irradiation with microwaves, so that the fluid through the heating tube formed of a good thermal conductor material is heated.

Preferably, the heating tube is provided with a fluid pressurizing unit on an upstream side thereof and with a throttle valve on a downstream side thereof, so that the internal pressure of the heating tube is increased by the fluid pressurizing unit, thereby preventing boiling of the fluid upon heating.

Preferably, the heating tube is provided on an upstream side thereof with a mixing unit wherein fluids are injected from a pair of opposite nozzles and mixed together by collision of the fluids with each other, thereby ensuring uniform mixing of said fluids.

Preferably, a treating vessel for treating the article to be treated is a closed type vessel maintained at a pressure greater than the saturation pressure of the treating fluid.

Preferably, the article to be treated is a substrate for semiconductor production.

According to the invention, there is also provided a treating system for treating an article to be treated with a heated fluid, in which a fluid heating unit comprises a heating tube through which the fluid is passed, said heating tube being heated by irradiation with microwaves.

Preferably, the heating tube is a double pipe assembly comprising an outer pipe, an inner pipe, a heating medium disposed between said outer pipe and said inner pipe, said heating medium generating heat by irradiation with microwaves, and a fluid passage for the fluid to be heated, said fluid passage being defined through said inner pipe formed of a good thermal conductor material.

Preferably, the heating tube is provided with a fluid pressurizing unit on an upstream side thereof and with a throttle valve on a downstream side thereof, so that the internal pressure of the heating tube is increased by the fluid pressurizing unit, thereby preventing boiling of the fluid upon heating.

Preferably, the heating tube is provided on an upstream side thereof with a mixing unit wherein fluids are injected from a pair of opposite nozzles and mixed together by collision of said fluids with each other, thereby ensuring uniform mixing of the fluids.

Preferably, a treating vessel for treating the article to be treated is a closed type vessel maintained at a pressure greater than the saturation pressure of said treating fluid.

PREFERABLE EMBODIMENTS OF THE INVENTION

The present invention provides a treating process and system for ensuring that a treating liquid is heated within a reduce period of time.

Figure 1:
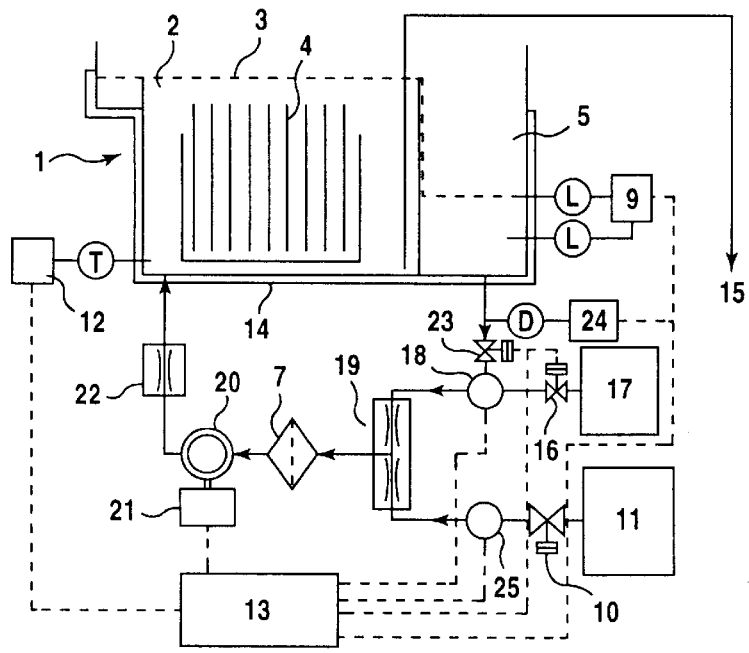
FIG. 1 is a schematic illustrative of one embodiment of the treating system according to the invention.

FIG. 1 is a schematic illustrative of one embodiment of the treating system according to the invention.

The treating system shown in FIG. 1 operates as follows. Articles 4 to be treated, for instance, semiconductor wafers, are placed in a treating vessel 1. A treating liquid feeding valve 16 is opened to feed a previously prepared treating liquid to a mixing unit 19 via a first pump 18. After passing through nozzles of the mixing unit 19, the treating liquid is passed through a filter 7 to a microwave heating unit 20 where the treating liquid is heated by irradiation with microwaves generated from a microwave generator 21.

Then, the treating liquid is fed through a throttle valve 22 into the treating vessel 1. With the treating liquid 2 in the treating vessel reaching a given liquid level 3, the treating liquid begins to overflow into a treating liquid reservoir 5. As the level of the treating liquid in the reservoir 5 is detected by a level sensor 9, the treating liquid feeding valve 16 is closed while a treating liquid circulating valve 23 is opened, so that the treating liquid is circulated from the reservoir 5 through the system via the first pump 18.

As the treating liquid is heated, there is a change in the concentration of the treating liquid due to the evaporation loss of the liquid component such as water. When the treating liquid is found by a concentration meter 24 to be more concentrated than a predetermined concentration, a diluting liquid feeding valve 10 is opened to feed an amount of diluting liquid from a diluting liquid reservoir 11 to a mixing unit 19 via a second pump 25. In the mixing unit 19 the diluting liquid and treating liquid are well mixed together, and then fed to the filter 7. A treating liquid loss incidental to removal of the article 4 is balanced up by fresh feeds from the treating liquid reservoir 17 and diluting liquid reservoir 11, so that a certain amount of the treating liquid is constantly kept in the treating vessel 1.

Outputs of a thermometer 12 for measuring the temperature of the treating liquid, the level sensor 9 and so on are fed to a control 13 to control valves such as the diluting liquid feeding valve 10, the first and second pumps, etc., so that the amount and temperature of the treating liquid are kept in the predetermined ranges. Both the treating vessel 1 and the treating liquid reservoir 5 are heated and insulated by a combined heating and insulating member 14 called a rubber heater.

The throttle valve 22 in the treating system of the invention ensures that the interior of the passage between the mixing unit and the throttle valve 22 can be kept at a positive pressure. This in turn makes a pressure difference between the mixer inlet and outlet, so that the power of dispersion of the diluting liquid in the treating liquid in the mixer can be kept high and the saturation pressure between the mixer and the throttle valve is increased; the treating liquid is heated in a stable manner at a temperature close to, or higher than, the boiling point of the treating liquid, and a great stirring effect is expected upon the inflow of the treating liquid into the treating vessel.

While the aforesaid embodiment of the system according to the invention has been described with reference to the mixing of the diluting liquid with the treating liquid, it is to be noted that instead of the diluting liquid fed via the diluting liquid feeding valve, the treating liquid may be mixed with any desired liquid agent.

Since the treating liquid in the heating tube is directly heated using the microwave heating unit, it is unnecessary to indirectly heat the tube filled with the treating liquid, etc., from the outside, and so it is unnecessary to heat the tube filled with the treating liquid to a high temperature.

It is thus possible to construct the heating tube not only of quartz or other material capable of standing up to high temperatures but also of synthetic resins such as fluorocarbon resin of great durability, typically polytetrafluoroethylene. Particular preference is given to a polytetrafluoroethylene tube that can be easily handled and readily shaped as desired.

Figure 2:
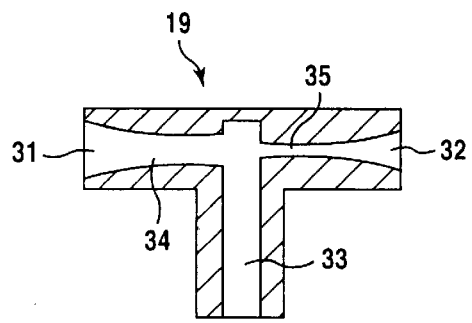
FIG. 2 is a schematic illustrative of the mixing unit according to the invention.

The mixing unit according to the invention is explained with reference to FIG. 2.

A mixing unit generally shown at 19 comprises a pair of coaxially located nozzles 31 and 32, one for the treating liquid and the other for the diluting liquid, and an outlet port 33. The treating liquid introduced from the nozzle 31 collides with the diluting liquid admitted from the nozzle 32 so that they are discharged from the outlet port 33 upon full mixing.

The diameters of orifices 34 and 35 in the nozzles 31 and 32 for the treating liquid and the diluting liquid, respectively, are determined depending on the flow rates of the fluids flowing therethrough. In general, however, since the flow rate of the fluid fed to the nozzle 32 is reduced relative to the flow rate of the fluid fed to the nozzle 31, the diameter of the orifice 34 is larger than that of the orifice 35.

Preferably, the mixing unit is built up of a material less likely to wear away due to the collision of fluids therewith, for instance, a material having a high hardness such as quartz or single crystal alumina.

Figure 3:
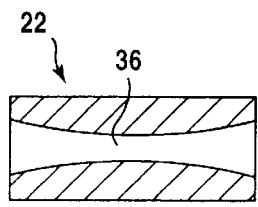
FIG. 3 is a schematic illustrative of the throttle valve used in the treating system of the invention.

The throttle valve used in the treating system of the invention is explained with reference to FIG. 3.

A throttle valve generally shown at 22 includes an orifice 36 extending through it to keep a positive pressure between it and the nozzles of the mixing unit 19 of the invention, located on an upstream side of the flow path. It is thus possible to prevent the boiling of the treating liquid while it is heated by a heating unit located in the piping between the mixing unit and the throttle valve, and so it is possible to efficiently heat the treating liquid.

Figure 4A:
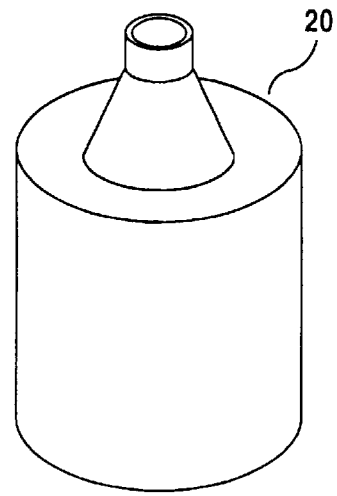
FIG. 4 is a schematic illustrative of the heating unit according to the invention.
Figure 4B:
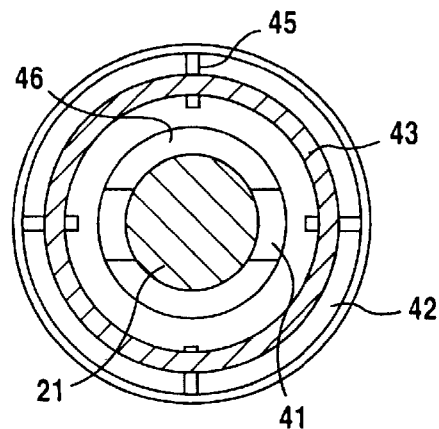
Figure 4C:
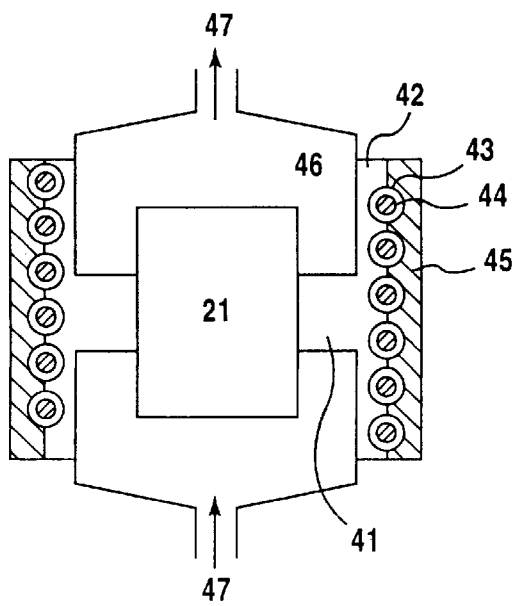

The heating unit of the invention is explained with reference to FIG. 4. FIG. 4(A) is a perspective view of the heating unit of the invention, FIG. 4(B) is a cross-sectional view of the heating unit, and FIG. 4(C) is a longitudinal section of the heating unit.

A heating unit generally shown at 20 includes at its center a microwave generator 21, typically a magnetron. Microwaves generated by the microwave generator 21 are guided through a waveguide 41 to a heating chamber 42, thereby directly heating a fluid 44 in a spirally extending heating tube 43 in the heating chamber. Preferably in this case, the heating tube is supported by a supporting means 45, thereby keeping the heating tube stationary against the passage of the fluid through the heating tube.

The microwave generator is provided therearound with a coolant path 46, so that the microwave generator can be cooled by a coolant 47 fed from a lower portion of the heating unit and discharged through an upper portion of the heating unit, thereby preventing its overheating.

The heating tube may be made up of any desired material which can transmit microwaves well but is neither decomposed nor otherwise adversely affected by microwaves. For this purpose, not only a quartz tube capable of standing up to high temperatures but also a tube of synthetic resin of great durability such as fluorocarbon resin, typically polytetrafluoroethylene may be used. A particularly preferred tube is a tube of polytetrafluoroethylene that can be easily handled and readily shaped as desired.

Outputs of microwaves fed to the microwave heating unit may be determined depending on the flow rate of the treating liquid to be heated. The inner diameter and length of the treating liquid heating tube, etc., too, may be determined depending on the flow rate of the treating liquid, etc. The frequency of microwaves may be one utilized for heating purposes, for instance, 2,450 MHz.

Another embodiment of the heating tube is explained with reference to FIG. 5.

Figure 5:
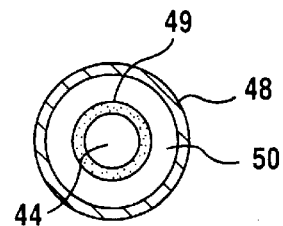
FIG. 5 is a sectional schematic illustrative of another embodiment of the heating tube.

FIG. 5 is a cross-sectional view of one of a plurality of spirally extending heating tube. A heating tube 43 has a double-tube structure comprising an outer tube 48 made up of a microwave transmitting material and an inner tube 49 made up of a good thermal conductor or metal. Between the outer tube 48 and the inner tube 49 there is filled a heating medium 50 which generates heat upon irradiation with microwaves, thereby heating the inner tube. It is thus possible to heat a fluid 44 in the inner tube by means of the microwave heating unit, even when the fluid 44 is a liquid or gas which does not generate heat upon irradiation with microwaves. The inner tube may be made up of any desired material which has high heat transfer efficiency and does not react with the fluid. However, preference is given to a stainless steel tube.

A closed type treating system including a treating vessel not open to the atmosphere is explained with reference to FIG. 6. In this case, the closed type treating vessel is more pressurized than atmospheric pressure.

After an article 4 to be treated is placed in a closed type treating vessel 61 with a lid 62 taken off, the lid 62 is put on to close up the treating vessel 61. A treating liquid feeding valve 16 is then opened to feed a previously prepared treating liquid from a treating liquid reservoir 17 to a mixing unit 19 via a first pump 18. The treating liquid passes through nozzles of the mixing unit to a filter 7, whence the treating liquid is supplied to a microwave heating unit 21 where it is heated by microwaves generated from a microwave generator 20. Then, the treating liquid is fed into the treating vessel 61 via a throttle valve 22.

As the closed type treating vessel 61 is filled with the thus supplied treating liquid, the treating liquid enters into a high-pressure treating reservoir 64 through a communicating pipe 63. With an increase in the treating liquid in the high-pressure treating liquid reservoir 64, an amount of air leaves the reservoir 64 through an air vent valve 65 and an escape valve 66 located above the reservoir 64. Upon the level of the treating liquid detected by a level sensor 9 located in the vicinity of the air vent valve 65, the air vent valve 65 is closed and the escape valve 66 is then closed. Subsequently, the treating liquid feeding valve 16 is closed to shut off the supply of the treating liquid. Finally, a treating liquid circulating valve 23 is opened to initiate the circulation of the treating liquid by the first pump 18.

Insofar as the closed type treating vessel 61 is concerned, it is unlikely that during the treatment the treating solution is discharged from the treating vessel to the outside or an evaporation loss of the treating liquid takes place. However, there may be a variation in the composition of the treating liquid during the treatment. In this case, the treating liquid feeding valve 16 is opened for the supply of the treating liquid and a diluting liquid valve 11 is opened for the supply of the diluting liquid. The thus supplied treating and diluting liquids are uniformly mixed together in the mixing unit 19, and then passed through the filter 7 to the microwave heating unit 20 where the mixture is heated to a given temperature. The heated fluid is then passed through the throttle valve 22 into the closed type treating vessel 61.

Upon the supply of the liquids from the treating liquid reservoir and the diluting liquid reservoir to the closed type treating vessel 61, the internal pressure of the treating vessel 61 increases. As the internal pressure increase is detected by a pressure sensor 67 attached to the high-pressure treating liquid reservoir 64, the treating liquid is introduced from a pressure reducing valve 68 in a pressure reducing tank 69, thereby preventing the internal pressure of the closed type treating vessel from exceeding a given value. Between the high-pressure treating liquid vessel 64 and the pressure reducing tank 69 there is provided a safety valve 70 to prevent an abnormal increase in the internal pressure of the closed type treating vessel 61. The treating liquid in the pressure reducing tank is discharged in the form of a drain 15 via a drain valve 71.

To remove a set of articles 4 from within the closed type treating vessel, the first and second pumps 18 and 25 are stopped to open the pressure reducing valve 68 until the internal pressure of the high-pressure treating liquid vessel 64 goes down to atmospheric pressure, so that a portion of the treating liquid is introduced in the pressure reducing tank. Thereafter, the lid 62 of the closed type treating vessel 61 is taken off to remove the set of articles 4. Then, a fresh set of articles 4 may be placed in the closed type treating vessel 61.

Figure 6:
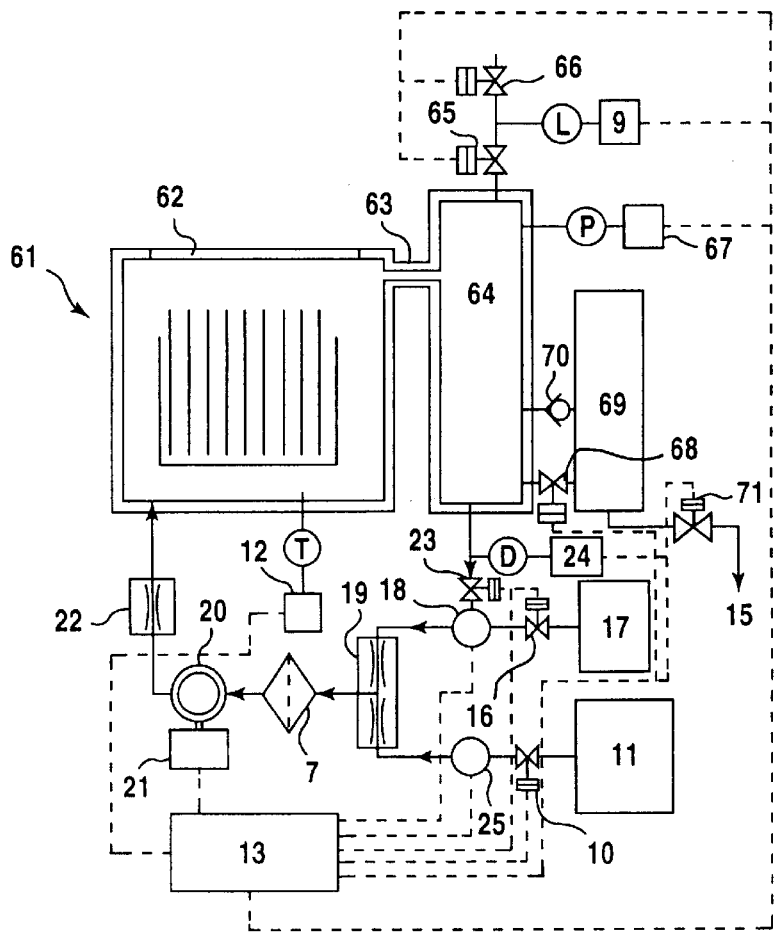
FIG. 6 is a schematic illustrative of the treating system including a closed type treating vessel.

In the treating system shown in FIG. 6, the high-pressure treating liquid reservoir is positioned between the closed type treating vessel and the pressure reducing tank. In the invention, however, the high-pressure treating liquid reservoir may be dispensed with. For instance, the closed type treating vessel may be connected to the pressure reducing tank via the pressure reducing valve while the closed type treating vessel is provided with an air vent valve, a pressure sensor, a liquid sensor and so on.

Figure 7:
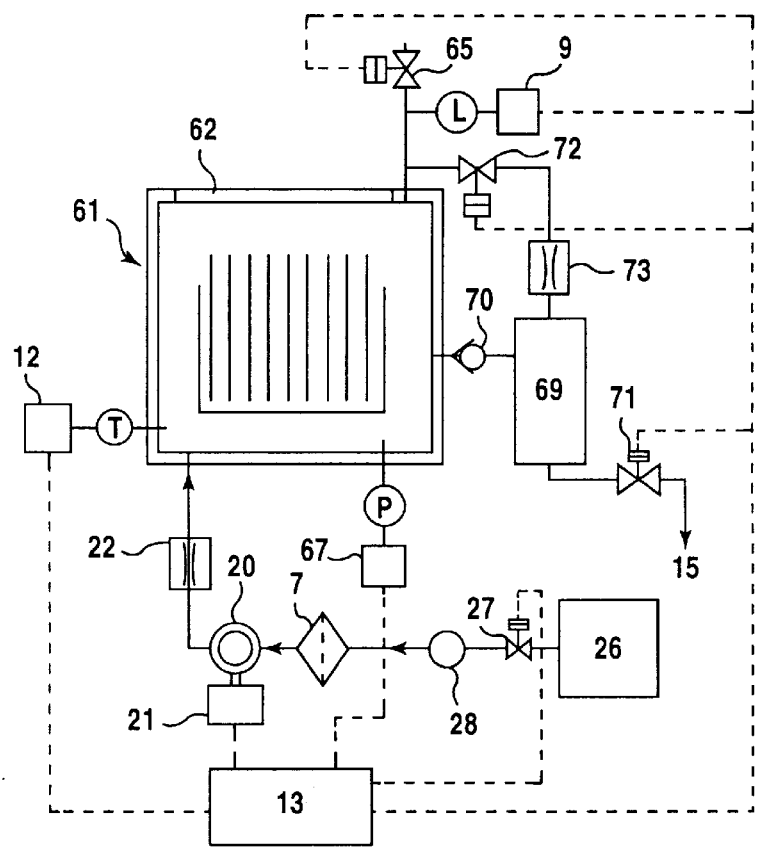
FIG. 7 is a schematic illustrative of the treating system for carrying out washing treatments with water.

FIG. 7 illustrates a treating system for water washing, which can be run at pressures higher than atmospheric pressure.

A lid 62 of a closed type treating vessel 61 is taken off to place a set of articles 4 therein. Then, the treating vessel 61 is closed up by putting the lid 62 thereon. A washing water feeding valve 27 is opened so that washing water is fed by a washing water feeding pump 28 from a washing water reservoir 26 through a filter 7 to a microwave generator 20 where the washing water is heated by a microwave heating unit 21 to which microwaves are supplied. The washing water is then supplied to the treating vessel 61 via a throttle valve 22.

While air is released from the closed type treating vessel 61 through an air vent valve 65, the supply of washing water is continued. As the washing water is detected by a level sensor 9, the air vent valve is so closed that a washing water release valve 72 is opened. The washing water is introduced in a pressure reducing tank 69 through a discharge throttle valve 73, whereupon the washing water is discharged in the form of a drain through a drain valve 71 mounted on the pressure reducing tank. Once the air vent valve has been closed, the washing water is continuously supplied for the washing treatment in the treating vessel.

With the treating system of FIG. 7 it is possible to carry out heating under conditions where boiling does not take place, because the washing water pressurized by the washing water feeding pump can be supplied so that the heating unit can be kept at a positive pressure under the action of the throttle valve 22.

By the provision of the discharge throttle valve 73 it is possible to conduct the washing treatment at high temperatures but under conditions where boiling does not take place, because a large pressure difference can be made between the interior of the closed type treating vessel 61 and the pressure reducing tank.

Thus, the washing treatment cannot only be conducted at a high temperature unavailable in an open state, but there is also no washing water loss due to the evaporation of the washing water from the treating vessel; it is unnecessary to make up for the washing water.

EXAMPLE

Reference will now be made to the application of the treating system according to the invention to a semiconductor fabrication process.

The treating system of the invention may find wide application in various treatments using treating liquids. However, it is preferable to apply the treating system of the invention to steps of treating silicon wafers which are repeatedly conducted in the semiconductor fabrication process, for instance, wet washing, wet resist removal, nitride film removal, and mask oxide film removal.

For instance, the application of the treating system to the step of nitride film removal in the semiconductor fabrication process is explained. Generally, a treating solution composed of 86% by weight of phosphoric acid and 14% by weight of water is used for the nitride film removal step. This treating solution has a boiling point of 160° C. as measured under atmospheric pressure. For heating the treating solution to 160° C. by an electrically heated wire method used for a conventional system, about 2 hours are needed, and an etching rate of 5 nm/min. is obtained at 160° C.

Since the treating solution is heated at a high temperature, however, losses of water from the treating solution due to evaporation, etc. are unavoidable. When such water losses are not restored, the concentration of phosphoric acid increases with the lapse of time and, with this, the nitride film etching rate decreases with an undesirable increase in the oxide film etching rate, as can be seen from FIG. 8 with time as abscissa and concentration A, temperature B, nitride film etching rate C and oxide film etching rate D as ordinate.

Figure 8:
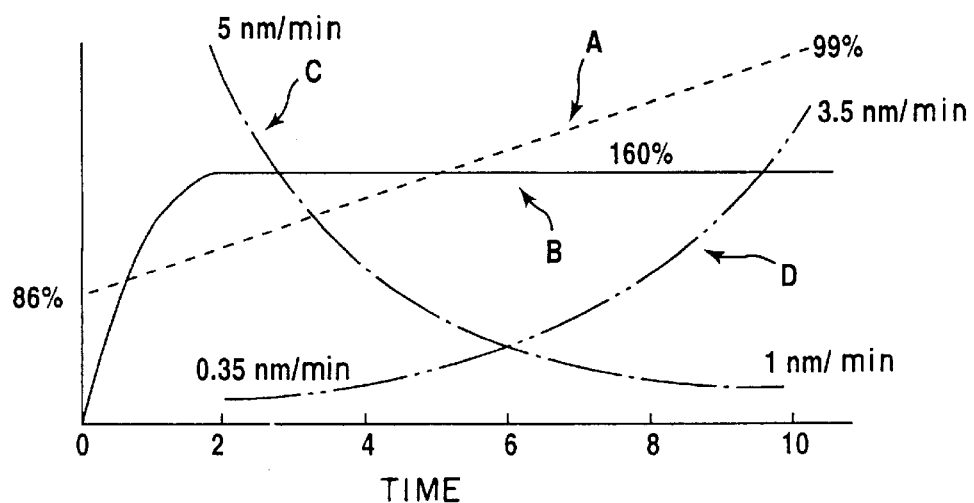
FIG. 8 is a representation illustrative of a conventional nitride film treatment.
Figure 9:
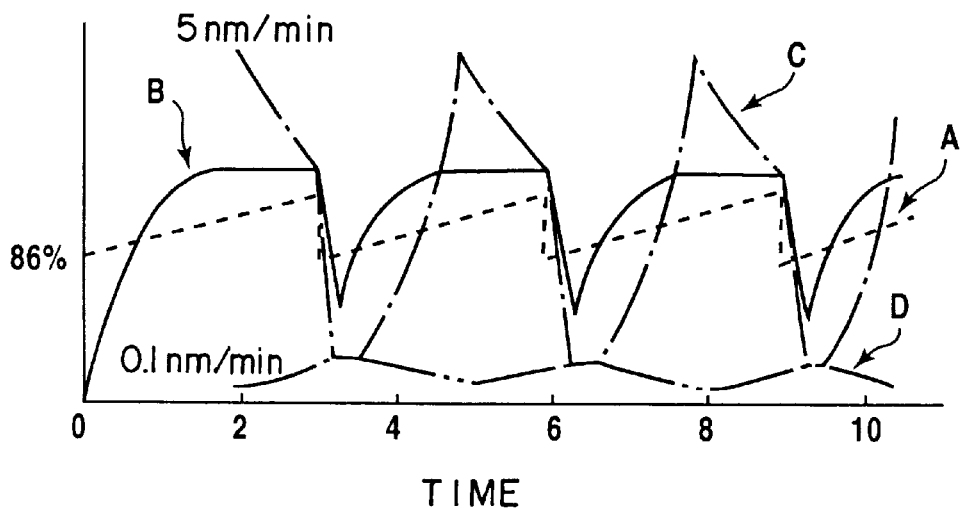
FIG. 9 is a representation illustrative of a conventional nitride film treatment.
Figure 10:
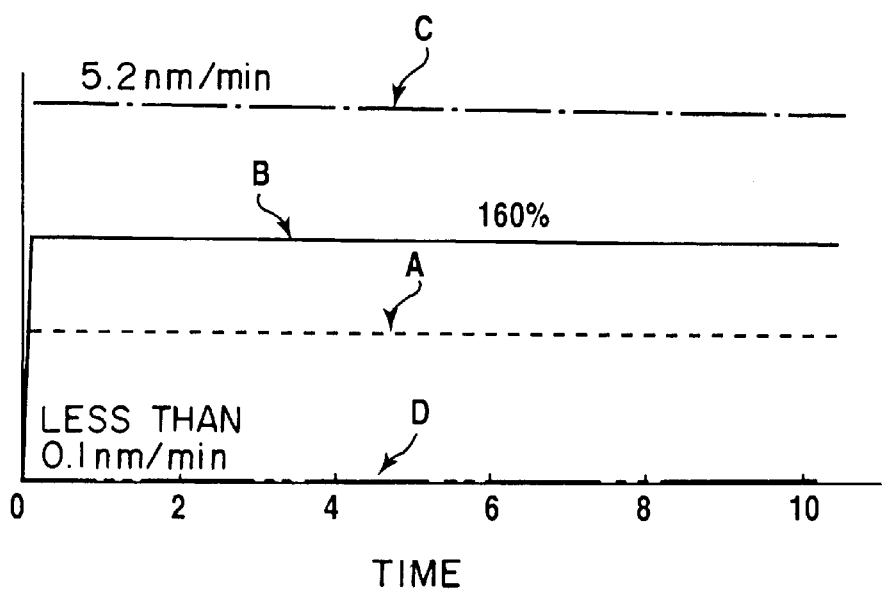
FIG. 10 is a schematic illustrative of the nitride film treatment according to the invention.
Figure 11:
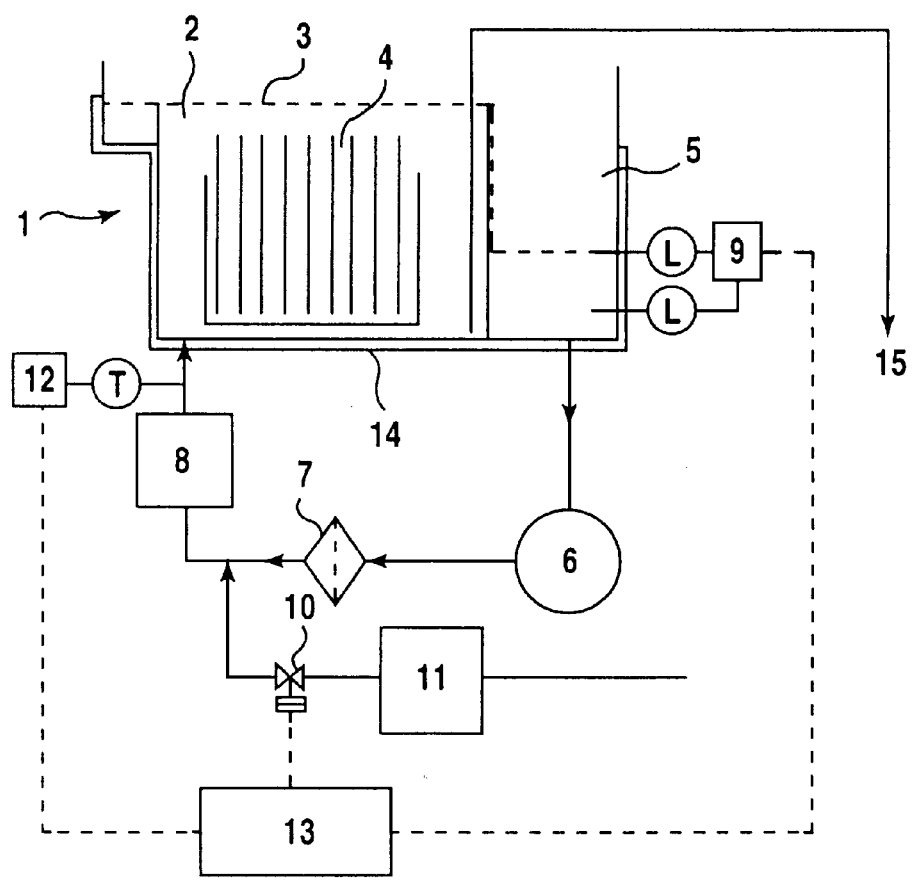
FIG. 11 is a representation illustrative of a conventional treating system.

Here consider the case where water losses are periodically restored in a conventional system. As can be seen from FIG. 9 with time as abscissa and concentration A, temperature B, nitride film etching rate C and oxide film etching rate D as ordinate, the initial behavior is similar to that in the absence of supply of water, as shown in FIG. 8. However, the concentration of phosphoric acid increases gradually, and continues to increase by the time water is replenished. On the other hand, the temperature of the treating solution decreases by supply of water, and the etching rate continues to decrease by the time the temperature of the treating solution rises. This case teaches that about a half of the treating time is expended to rise the temperature of the treating solution; treatment efficiency drops.

According to the process of the invention wherein the microwave heating unit is used, however, the time needed for bringing the treating solution up to a temperature close to its boiling temperature is barely about 10 minutes. Even while the treating solution is being heated, a water loss, if any, can be detected by the concentration sensor, so that the diluting liquid is supplied to the mixing unit having great dispersing and mixing efficiency, where the treating solution is uniformly mixed with the diluting liquid, thereby ensuring that the concentration of phosphoric acid in the treating solution is kept constant. It is thus possible to keep the nitride film etching rate not only high but also always constant all over the treating period.

It is here to be noted that the nitride film etching step using phosphoric acid for the treating solution may be carried out with either one of the treating system of FIG. 1 open to the air and the treating system of FIG. 6 using a closed type treating vessel.

Next, the mixing of the treating solution by the mixing unit is explained.

Even when a treating solution having a low boiling point, it is preferable to pressurize the treating solution to a pressure at which the treating solution does not boil. If, for instance, phosphoric acid is pressurized at its boiling point of 160° C. to at least 6.1 atm. at which water boils, it is then possible to mix them in a stable manner because the water is unlikely to vaporize.

Therefore, if a pressure at which water is unlikely to vaporize is applied to the piping from the first pump to the throttle valve in the system of FIG. 1 or FIG. 6, it is then possible to keep the heating treatment stable.

As an example, consider the case where phosphoric acid is mixed with water in the mixing unit. In this case, phosphoric acid is supplied from the treating liquid side while water is supplied from the diluting liquid side. Here assume that the diameter of the orifice on the treating solution side is 2.39 mm, the diameter of the orifice on the diluting liquid side is 0.8 mm, phosphoric acid is supplied as the treating liquid at a flow rate of 9 L/min. and a pressure of 10 kgf/cm$^2$, and water is supplied as the diluting liquid at a flow rate of 1 L/min. and a pressure of 10 kgf/cm$^2$. Then, phosphoric acid having a concentration of 86% by weight is obtained at a pressure of 10 kgf/cm$^2$.

If, for instance, a nozzle having an orifice diameter of 2.5 mm is used as the throttle valve, it is then possible to keep the heating section at a pressure of 10 kgf/cm$^2$.

According to the invention, a fluid used for the treatment of articles can be heated within a short time period while the saturation pressure of the fluid is increased, and so efficient heating is feasible. In addition, a fluid having a consistent concentration can be obtained by using as fluid mixing means a mixing unit capable of achieving extremely uniform mixing. Thus, stable treatments are achievable.

What is claimed is:

1. A process for preparing a fluid for treating an article and treating the article, comprising the steps of:

heating said fluid as it flows through a heating tube by irradiating said heating tube with microwaves;

pressurizing said fluid on an upstream side of said heating tube;

constricting said fluid on a downstream side of said heating zone with a throttle valve, thereby increasing an internal pressure of said heating tube and preventing boiling of said fluid upon heating; and treating said article with said heated fluid.

2. The process according to claim 1, wherein said heating step includes injecting fluids from a pair of opposite nozzles on said upstream side of said heating tube and mixing together by collision of said fluids with each other, thereby ensuring uniform mixing of said fluids.

3. The process according to claim 2, wherein said treating step includes treating said article in a closed vessel maintained at a pressure greater than a saturation pressure of said treating fluid.

4. The process according to claim 3, wherein said article is a substrate for semiconductor production.

5. The process according to claim 3, wherein said article is a substrate for semiconductor production.

6. The process according to claim 1, wherein said heating tube includes a heating medium that generates heat upon irradiation with microwaves, so that said fluid through said heating tube formed of a good thermal conductor material is heated.

7. The process according to claim 6, wherein said heating step includes injecting fluids from a pair of opposite nozzles on an upstream side of said heating tube and mixing together by collision of said fluids with each other, thereby ensuring uniform mixing of said fluids.

8. The process according to claim 7, wherein a treating vessel for treating said article is a closed vessel maintained at a pressure greater than a saturation pressure of said treating fluid.

9. The process according to claim 8, wherein said article is a substrate for semiconductor production.

10. The process according to claim 7, wherein said article is a substrate for semiconductor production.

11. A heating system for heating a fluid used in treating an article in a treating vessel said heating system comprising: a heating tube through which a fluid is passed a microwave unit for irradiating said heating tube with microwaves, and said heating tube having a fluid pressurizing unit on an upstream side thereof and a throttle valve on a downstream side thereof, so that an internal pressure of said heating tube is increased by said fluid pressurizing unit while a fluid passage is throttled by said throttle valve, thereby preventing boiling of said fluid upon heating.

12. The heating system according to claim 11, characterized in that said heating tube is provided on an upstream side thereof with a mixing unit wherein fluids are injected from a pair of opposite nozzles and mixed together by collision of said fluids with each other, thereby ensuring uniform mixing of said fluids.

13. The heating system according to claim 12, wherein a treating vessel for treating said article is a closed vessel maintained at a pressure greater than a saturation pressure of said treating fluid.

14. The heating system according to claim 11, characterized in that said heating tube is a double pipe assembly comprising an outer pipe, an inner pipe, a heating medium disposed between said outer pipe and said inner pipe, said heating medium generating heat by irradiation with microwaves, and a fluid passage for the fluid to be heated, said fluid passage being defined through said inner pipe formed of a good thermal conductor material.

15. The heating system according to claim 14, characterized in that said heating tube is provided with a fluid pressurizing unit on an upstream side thereof and with a throttle valve on a downstream side thereof, so that an internal pressure of said heating tube is increased by said fluid pressurizing unit, thereby preventing boiling of the fluid upon heating.

16. The heating system according to claim 14 or 15, characterized in that said heating tube is provided on an upstream side thereof with a mixing unit wherein fluids are injected from a pair of opposite nozzles and mixed together by collision of said fluids with each other, thereby ensuring uniform mixing of said fluids.

17. The heating system according to claim 16, wherein a treating vessel for treating said article is a closed vessel maintained at a pressure greater than a saturation pressure of said treating fluid.

18. The heating system according to claim 17, characterized in that said article is a substrate for semiconductor production.

19. The heating system according to claim 16, characterized in that said article is a substrate for semiconductor production.

* * * * *